(12) United States Patent
Holt et al.

(10) Patent No.: US 11,217,584 B2
(45) Date of Patent: Jan. 4, 2022

(54) LIMITING LATERAL EPITAXY GROWTH AT N-P BOUNDARY USING INNER SPACER, AND RELATED STRUCTURE

(71) Applicant: GLOBALFOUNDRIES U.S. INC., Santa Clara, CA (US)

(72) Inventors: Judson R. Holt, Ballston Lake, NY (US); Jiehui Shu, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 62 days.

(21) Appl. No.: 16/660,868

(22) Filed: Oct. 23, 2019

(65) Prior Publication Data

US 2021/0125984 A1 Apr. 29, 2021

(51) Int. Cl.
| | |
|---|---|
| H01L 27/092 | (2006.01) |
| H01L 21/8238 | (2006.01) |
| H01L 21/8234 | (2006.01) |
| H01L 27/088 | (2006.01) |
| H01L 21/84 | (2006.01) |
| H01L 27/12 | (2006.01) |
| H01L 29/417 | (2006.01) |
| H01L 21/82 | (2006.01) |
| H01L 29/66 | (2006.01) |

(52) U.S. Cl.
CPC ............ *H01L 27/092* (2013.01); *H01L 21/82* (2013.01); *H01L 21/8238* (2013.01); *H01L 21/823431* (2013.01); *H01L 21/823821* (2013.01); *H01L 21/823864* (2013.01); *H01L 21/845* (2013.01); *H01L 27/0886* (2013.01); *H01L 27/0924* (2013.01); *H01L 27/1211* (2013.01); *H01L 29/41791* (2013.01); *H01L 29/66795* (2013.01)

(58) Field of Classification Search
CPC ..... H01L 21/823431; H01L 21/823821; H01L 21/845; H01L 21/823864; H01L 21/8238; H01L 21/82; H01L 29/41791; H01L 29/66795; H01L 27/0886; H01L 27/0924; H01L 27/1211; H01L 27/092
See application file for complete search history.

(56) References Cited

U.S. PATENT DOCUMENTS 9,159,630 B1 * 10/2015 Wei ................. H01L 21/823821
10,008,576 B2    6/2018 Mulfinger et al.
(Continued)

*Primary Examiner* — Galina G Yushina
(74) *Attorney, Agent, or Firm* — Francois Pagette; Hoffman Warnick LLC

(57) ABSTRACT

A method limits lateral epitaxy growth at an N-P boundary area using an inner spacer. The method may include forming inner spacers on inner sidewalls of the inner active regions of a first polarity region (e.g., n-type) and an adjacent second polarity region (e.g., p-type) that are taller than any outer spacers on an outer sidewall of the inner active regions. During forming of semiconductor layers over the active regions (e.g., via epitaxy), the inner spacers abut and limit lateral forming of the semiconductor layers. The method generates larger semiconductor layers than possible with conventional approaches, and prevents electrical shorts between the semiconductor layers in an N-P boundary area. A structure includes the semiconductor epitaxy layers separated from one another, and abutting respective inner spacers. Any outer spacer on the inner active region is shorter than a respective inner spacer.

20 Claims, 11 Drawing Sheets

(56) References Cited

U.S. PATENT DOCUMENTS

| | | | |
|---|---|---|---|
| 10,020,307 B1* | 7/2018 | Holt | H01L 21/823814 |
| 10,262,903 B2 | 4/2019 | Holt et al. | |
| 10,269,932 B1 | 4/2019 | Arya et al. | |
| 2011/0272810 A1* | 11/2011 | Clevenger | H01L 21/76807 |
| | | | 257/741 |
| 2017/0207126 A1* | 7/2017 | Ching | H01L 21/26586 |
| 2018/0366324 A1* | 12/2018 | Cao | H01L 21/28255 |
| 2018/0374759 A1* | 12/2018 | Holt | H01L 21/823814 |
| 2019/0304984 A1* | 10/2019 | Chang | H01L 29/0847 |
| 2020/0295200 A1* | 9/2020 | Xie | H01L 21/823878 |

* cited by examiner

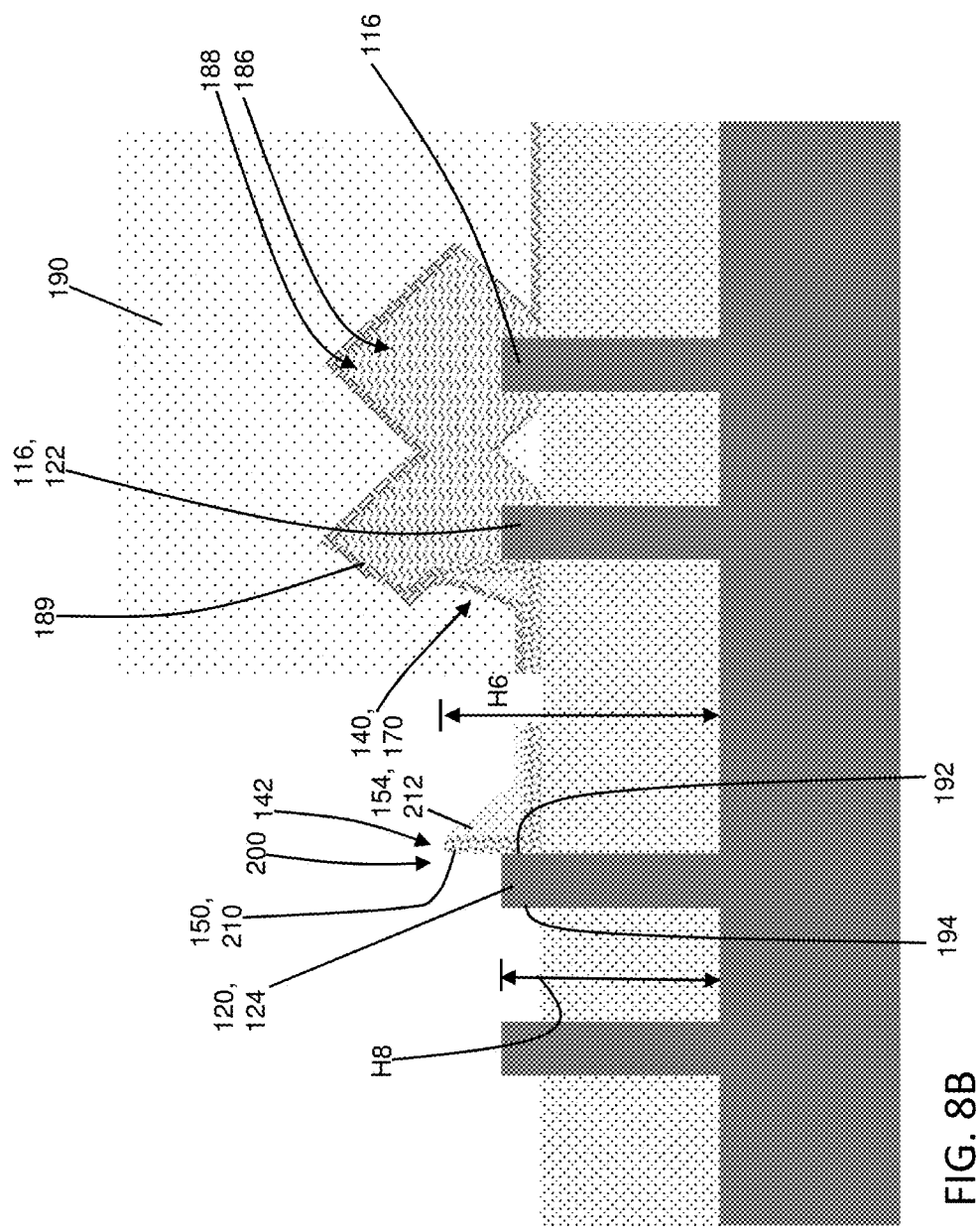

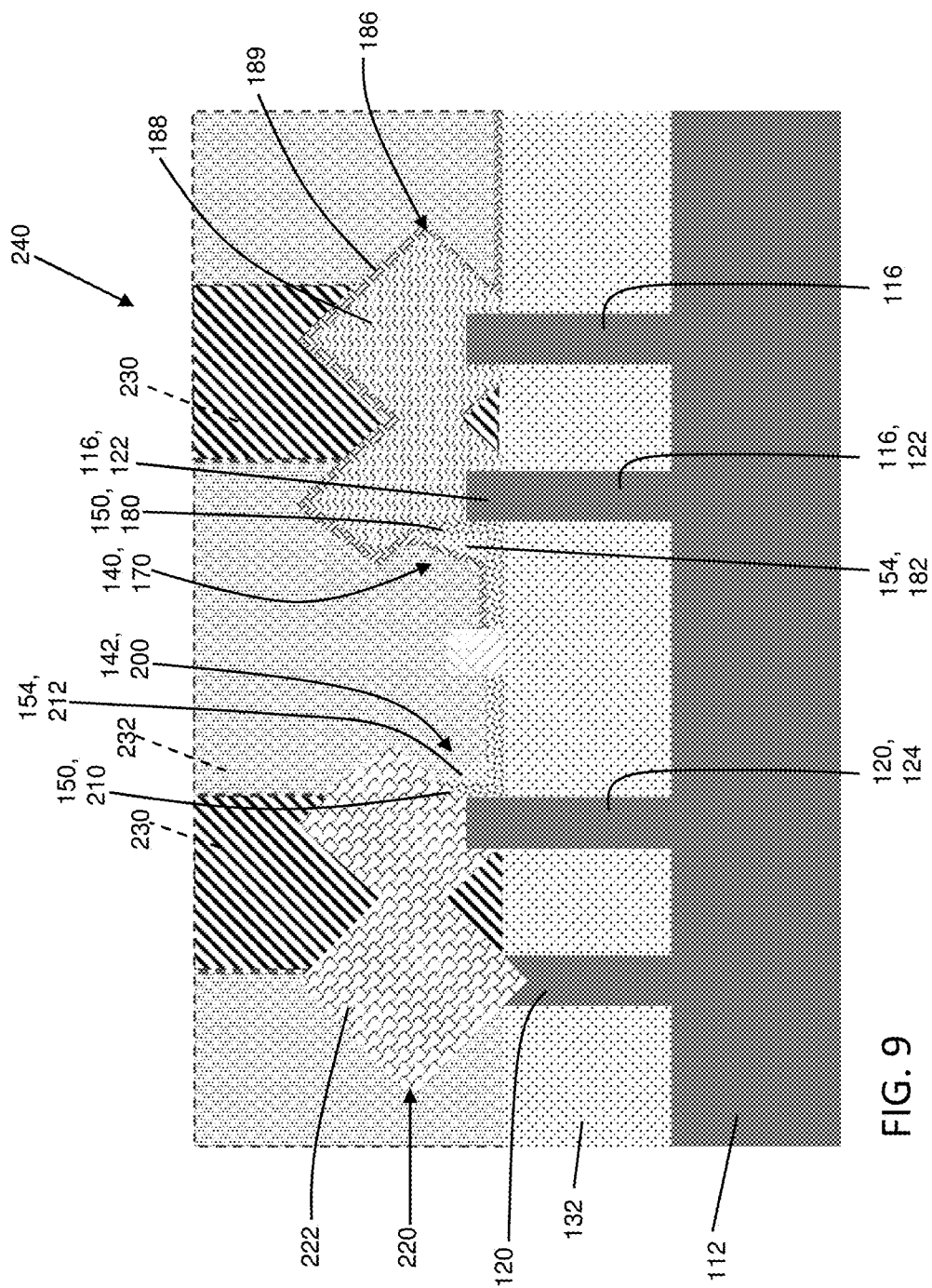

LIMITING LATERAL EPITAXY GROWTH AT N-P BOUNDARY USING INNER SPACER, AND RELATED STRUCTURE

BACKGROUND

The present disclosure relates to integrated circuit (IC) fabrication, and more specifically, to a method limiting lateral epitaxy growth at an N-P boundary area using an inner spacer on an inner active region, and a related structure.

Advanced manufacturing of ICs requires formation of individual circuit elements, e.g., field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Source/drain regions oftentimes have an upper surface of semiconductor enlarged using epitaxy to improve device performance, e.g., by reducing contact resistance to the source/drain regions. The terms "epitaxy," "epitaxial growth" and "epitaxially formed and/or grown" means the growth of a semiconductor material on a deposition surface of a semiconductor material, in which the semiconductor material being grown may have the same crystalline characteristics as the semiconductor material of the deposition surface. The tight pitch between different polarity FETs, e.g., p-type finFETs and n-type finFETs, at an N-P boundary area leaves very little space for larger source/drain epitaxy regions. Where the epitaxy regions are laterally too large, it can result in electrical shorts between nFET and pFET source/drain epitaxy regions.

SUMMARY

A first aspect of the disclosure is directed to a structure, comprising: a substrate having a first set of active regions and a second set of active regions, the first set of active regions having a first inner active region adjacent to and spaced from a second inner active region of the second set of active regions; a first inner spacer on the first inner active region; a second inner spacer on the second inner active region; a first semiconductor layer over the first set of active regions, including the first inner active region, the first semiconductor layer abutting the first inner spacer; and a second semiconductor layer over the second set of active regions, including the second inner active region, the second semiconductor layer abutting the second inner spacer, and wherein the first and second semiconductor layer are separated from one another.

A second aspect of the disclosure includes a structure, comprising: a substrate having a first set of fins and a second set of fins, the first set of fins having a first inner fin adjacent to and spaced from a second inner fin of the second set of fins; a first inner spacer on the first inner fin; a second inner spacer on the second inner fin, wherein the first inner spacer and the second inner spacer have different heights; a first semiconductor epitaxy layer over the first set of fins, including the first inner fin, the first semiconductor epitaxy layer abutting the first inner spacer; and a second semiconductor epitaxy layer over the second set of fins, including the second inner fin, the second semiconductor epitaxy layer abutting the second inner spacer, and wherein the first and second semiconductor epitaxy layers are separated from one another.

A third aspect of the disclosure related to a method, comprising: at a boundary area on a substrate between a first polarity region including a first set of active regions and a second, different polarity region including a second set of active regions spaced from the first set of active regions: forming a first spacer on sidewalls of a first inner active region, the first spacer including a first inner spacer on an inner sidewall of the first inner active region that is taller than any first outer spacer an outer sidewall of the first inner active region; forming a first semiconductor layer over the first set of active regions including the first inner active region, the first inner spacer abutting and limiting lateral forming of the first semiconductor layer; forming a second spacer on sidewalls of a second inner active region of the second set of active regions, the second spacer including a second inner spacer on an inner sidewall of the second inner active region of the second set of active regions that is taller than any second outer spacer an outer sidewall of the second inner active region of the second set of active regions; and forming a second semiconductor layer over the second set of active regions including the second inner active region, the second inner spacer abutting and limiting lateral forming of the second semiconductor layer, wherein the first and second semiconductor layer are separated from one another.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 8B shows a cross-sectional view of forming the second spacer including the second inner spacer, according to another embodiment of the disclosure.

FIG. 9 shows a cross-sectional view of forming a second semiconductor layer using the second spacer and a structure including inner spacers, according to another embodiment of the disclosure.

Figure 1:
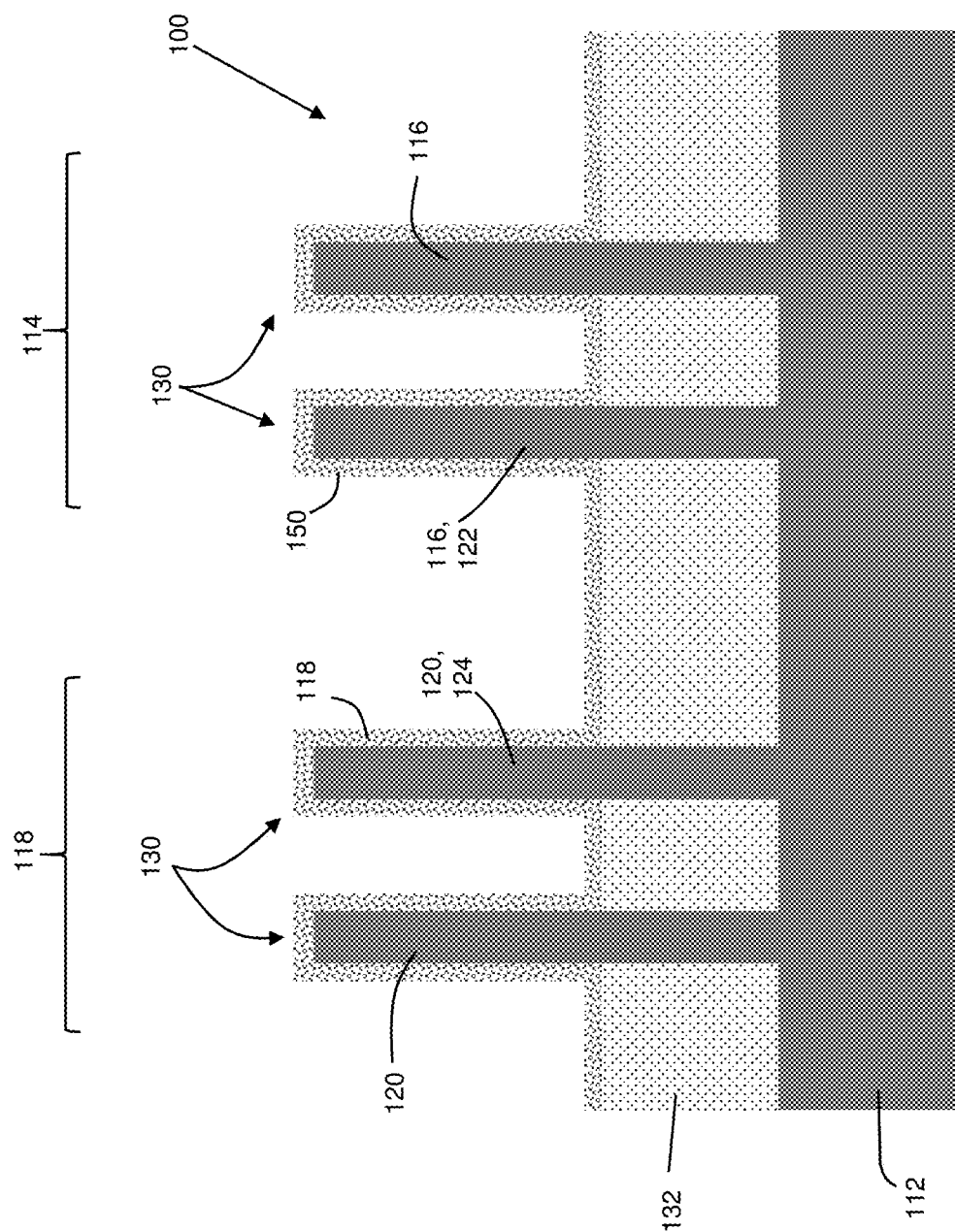
FIG. 1 shows a cross-sectional view of a preliminary structure including a first spacer layer, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a method that limits lateral semiconductor growth, e.g., for source/drain epitaxy, at an N-P boundary area using an inner spacer on an inner active region. The method may include forming inner spacers on inner sidewalls of the inner active regions of a first polarity region (e.g., n-type active) and an adjacent second polarity region (e.g., p-type). The inner spacers are taller than any outer spacers on an outer sidewall of the inner active regions. During forming of semiconductor layers (e.g., via epitaxy) over the active regions, the inner spacers abut and limit lateral forming of the semiconductor layers. The method generates larger semiconductor epitaxy layers than possible with conventional approaches, and prevents electrical shorts between the epitaxy layers. A structure includes the semiconductor epitaxy layers separated from one another, and abutting respective inner spacers. Any outer spacer on the inner active region is shorter than a respective inner spacer.

Referring to the drawings, embodiments of a method will now be described. For purposes of description, FIG. 1 shows a cross-sectional view of a preliminary structure 100 near an N-P boundary area on a substrate 112 between a first polarity region 114, e.g., n-type, including a first set of active regions 116 and a second different polarity region 118, e.g., p-type, including a second set of active regions 120. It is understood that the polarity types may be reversed in position. Second set of active regions 120 are spaced from first set of active regions 116. In the illustrative example shown, sets of active regions 116, 120 each include semiconductor fins extending from substrate 112. It is emphasized that the teachings of the disclosure are not limited to any particular type of active region, and may be applicable to other forms such as bulk and/or nanosheet active regions. Substrate 112 and sets of active regions 116, 120 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire semiconductor substrate may be strained.

Among first and second sets of active regions 116, 120, first set of active regions 116 has a first inner active region 122 adjacent to and spaced from a second inner active region 124 of second set of active regions 120. That is, first inner active region 122 is spaced from second inner active region 124. It is understood that gates that extend perpendicularly over sets of active regions 116, 120 are set in a plane, not shown, parallel with the page. FIG. 1 and the figures that follow each show a cross-sectional view through a source/drain region 130 in sets of active regions 116, 120 that is uncovered on either side of a gate. Sets of active regions 116, 120 may be formed using any appropriate semiconductor fabrication technique, e.g., patterning and etching from substrate 112. Source/drain regions 130 may be formed in sets of active regions 116, 120 using any now known or later developed techniques, e.g., ion implanting of a dopant or in-situ doping and annealing to drive in the dopants. As understood, the dopants vary depending on in which polarity region 114, 118 the active regions are located.

FIG. 1 also shows a shallow trench isolation (STI) 132 isolating sets of active regions 116, 120. Each STI 132 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

FIGS. 1-9 show cross-sectional views of forming a first spacer 140 (see e.g., FIGS. 6A-6B) on sidewalls of first inner active region 122 of first set of active regions 116 (in first (n-type) polarity region 114), and a second spacer 142 (see e.g., FIGS. 8A-8B) on sidewalls of second inner active region 124 of second set of active regions 120 (in second (p-type) polarity region 118).

FIG. 1 shows forming a first spacer layer 150 over first set of active regions 116 including first inner active region 122, and over second set of active regions 120 including second inner active region 124. First spacer layer 150 may include any now known or later developed low dielectric constant (low-K) dielectric such as but not limited to hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) [$(CH_3)_2SiO]_4$ 2.7 available from Air Liquide, etc. or other low-K dielectrics (K<3.9). First spacer layer 150 may be formed using any appropriate deposition technique.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. First spacer layer 150 may be deposited, for example, using ALD.

Figure 2:
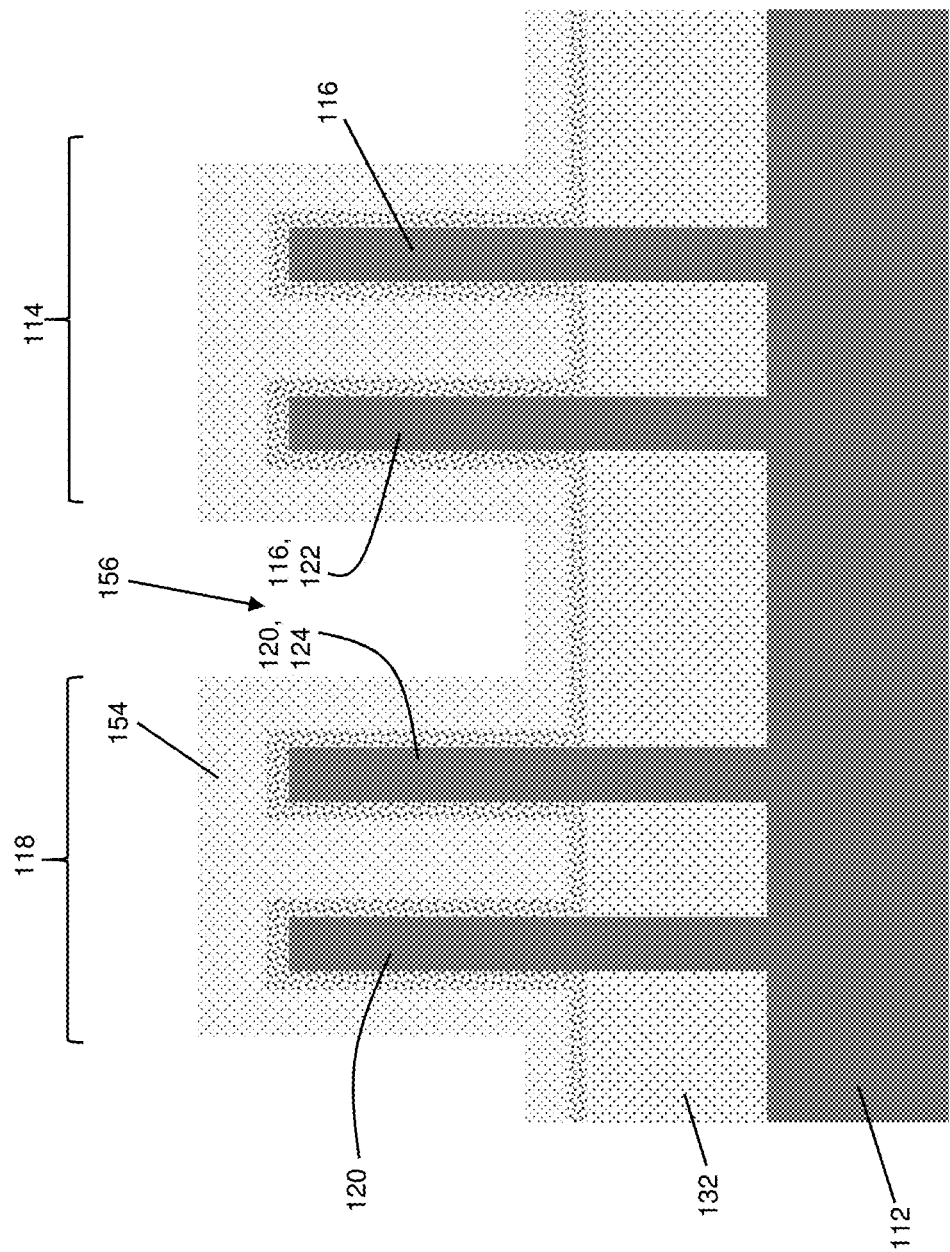
FIG. 2 shows a cross-sectional view of forming of a second spacer layer, according to embodiments of the disclosure.

FIG. 2 shows a cross-sectional view of forming a second spacer layer 154 over first spacer layer 150. As illustrated in FIG. 2, second spacer layer 154 formation preserves (at least some of) space 156 between first and second inner active regions 122, 124. Second spacer layer 154 is made of a different material than first spacer layer 150, and as will be described, functions mostly as a sacrificial layer, although some remnants thereof may form part of first and second spacers 140, 142 (FIGS. 6A, 8A); hence, its naming as a "second spacer layer." In non-limiting examples, second spacer layer 154 may include: silicon oxide ($SiO_2$), titanium oxide ($TiO_2$), or aluminum oxide ($Al_2O_3$). Second spacer layer 154 may be formed using any appropriate deposition technique, e.g., ALD.

Figure 3:
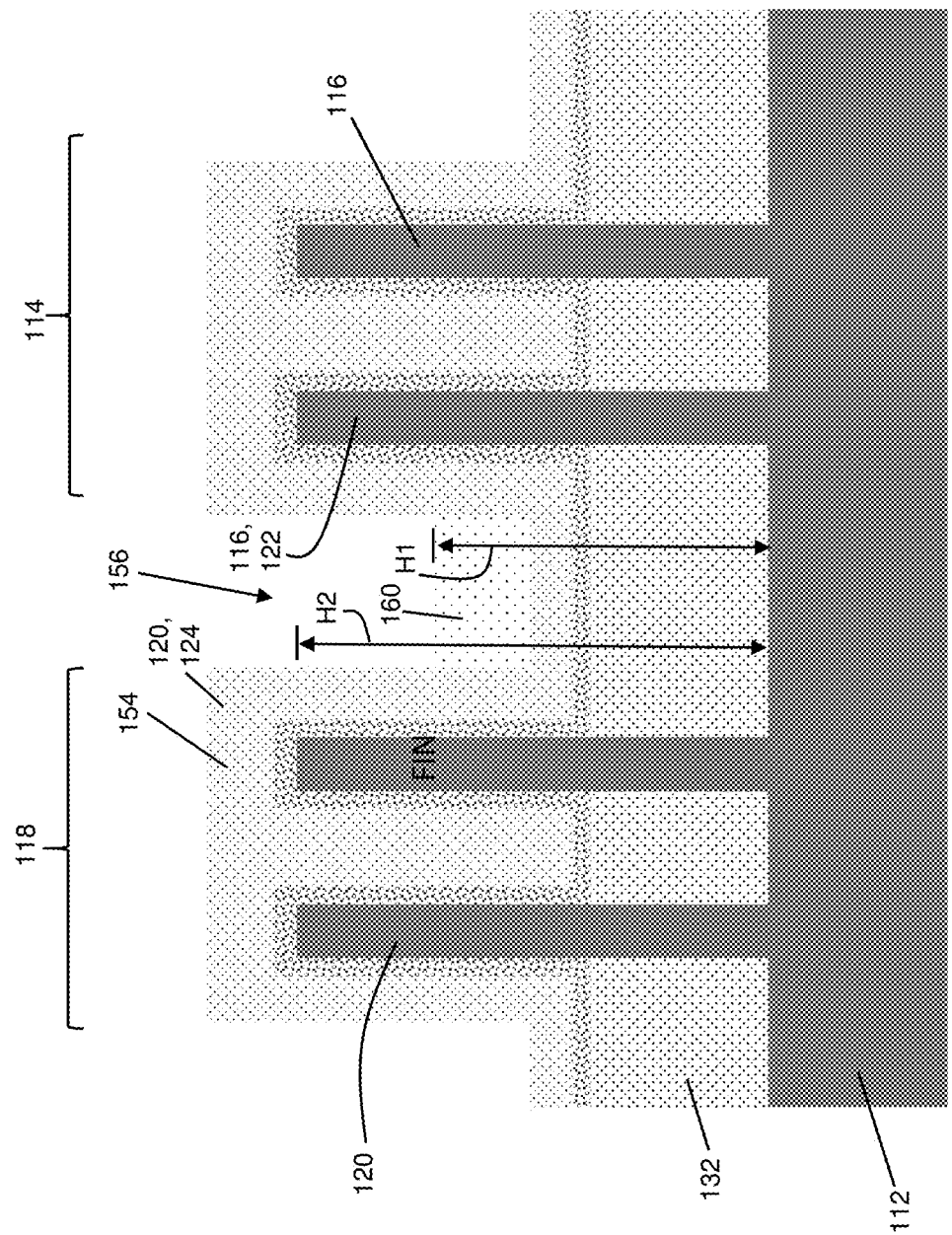
FIG. 3 shows a cross-sectional view of forming a mask for second spacer layer removal, according to embodiments of the disclosure.

FIG. 3 shows a cross-sectional view of forming a mask 160 in space 156 between first and second inner active regions 122, 124. As illustrated, mask 160 has a first height H1 less than a second height H2 of first and second inner active regions 122, 124. Each height H1, H2, etc., may be measured relative to, for example, an upper surface of substrate 112. Mask 160 may include any appropriate masking material. Common masking materials are photoresist (resist) and nitride. Nitride is usually considered to be a "hardmask," e.g., a spin-on hardmask (SOH). Mask 160 may alternatively include a developable organic planarization layer (OPL). Mask 160 may be formed by depositing a masking material and repeatedly etching to pattern the mask until it has the desired first height H1 in space 156. As will be described, the first height H1 of mask 160 may at least partially define a height H3, H4 (FIGS. 6A, 8A) of first and second spacers 140, 142 (FIGS. 6A, 8A), respectively.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Mask 160 may be etched, for example, using a RIE.

Figure 4:
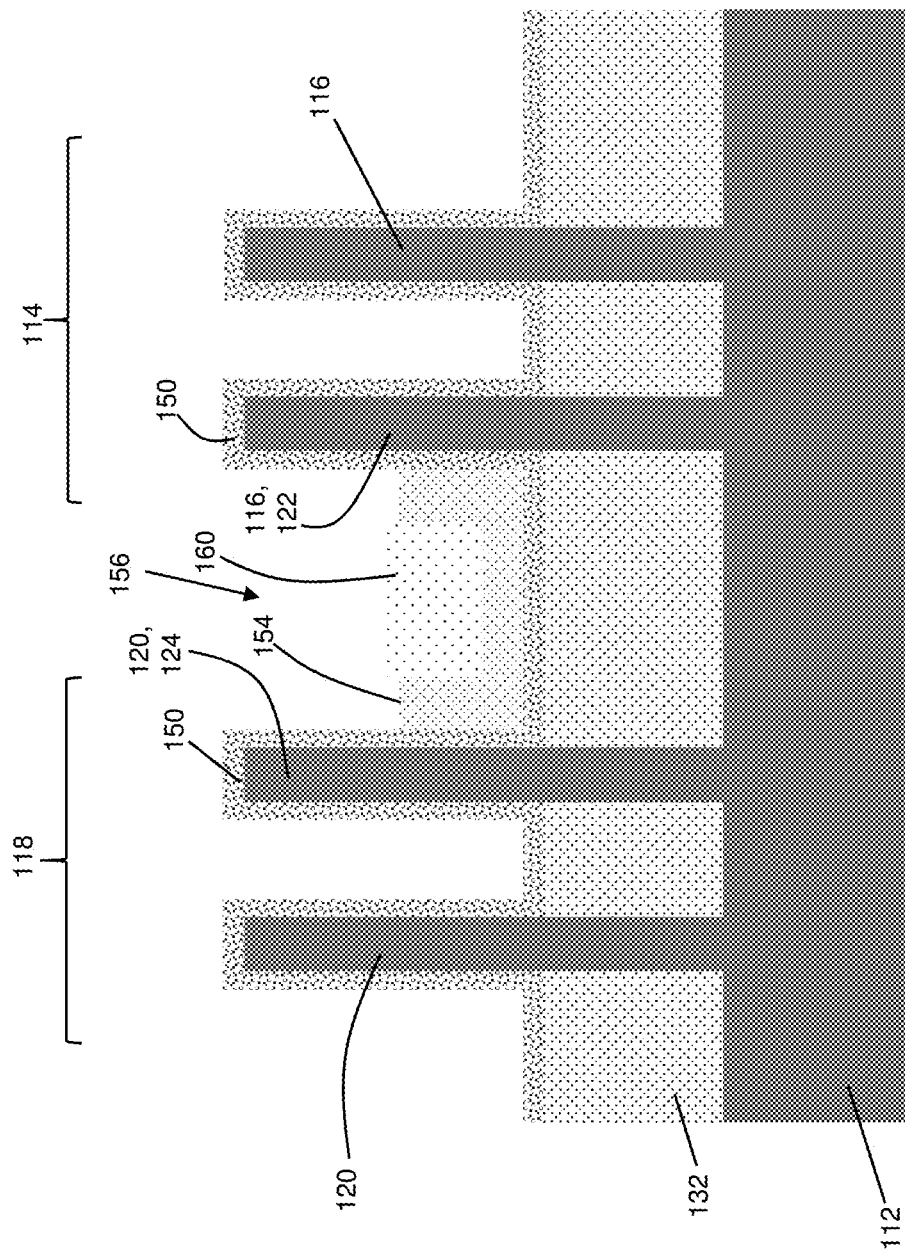
FIG. 4 shows a cross-sectional view of removing part of the second spacer layer, according to embodiments of the disclosure.

FIG. 4 shows a cross-sectional view of removing second spacer layer 154 other than where covered by mask 160. Second spacer layer 154 may be removed by etching, e.g., a flourine-based wet etch. The removing process leaves second spacer layer 154 under mask 160 but removes it elsewhere, leaving first spacer layer 150. At this stage, mask 160 can be removed, e.g., using any now known or later developed ashing process appropriate for the material of mask 160.

Figure 5:
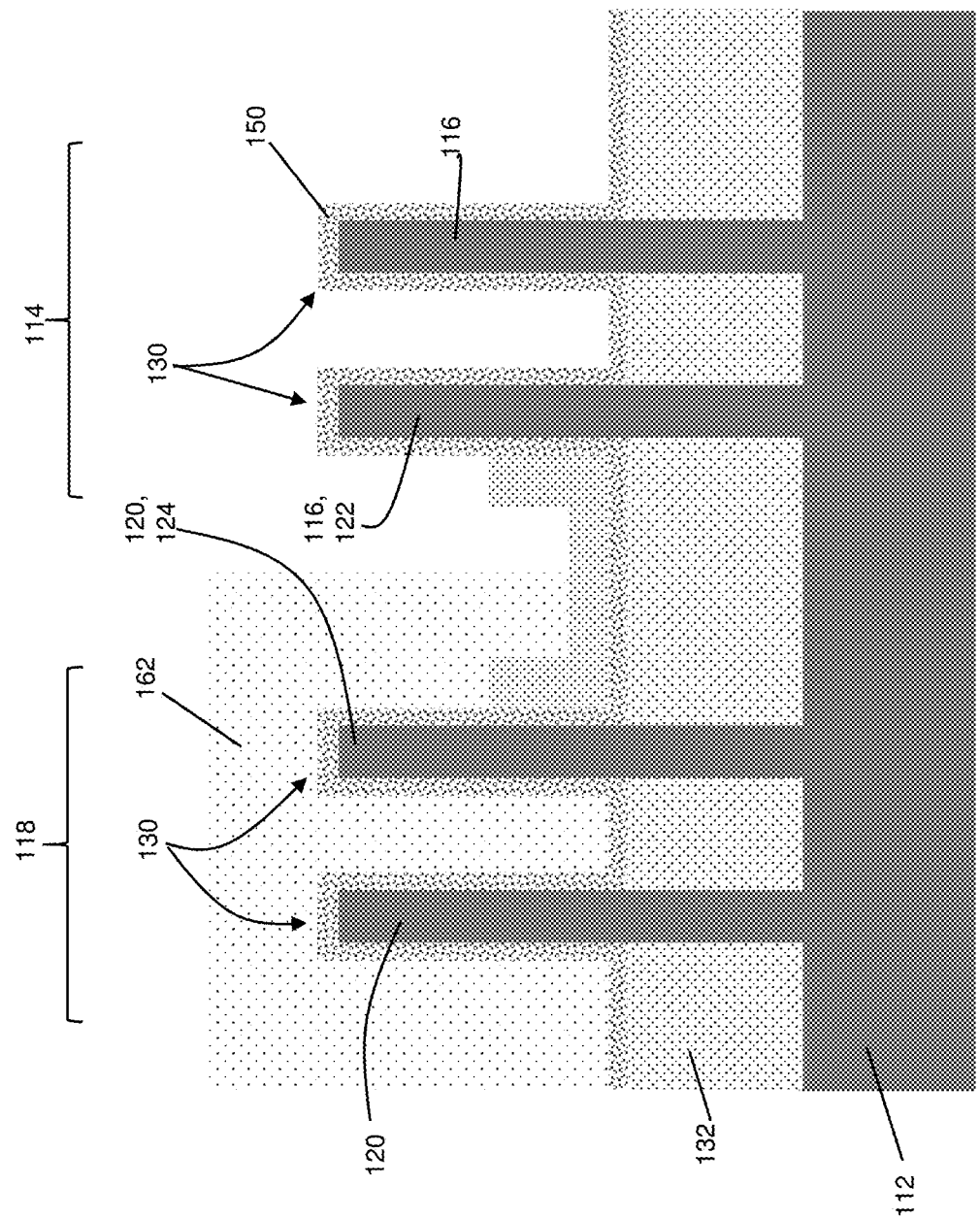
FIG. 5 shows a cross-sectional view of forming a mask for a first spacer etching in a first polarity region, according to embodiments of the disclosure.
Figure 6A:
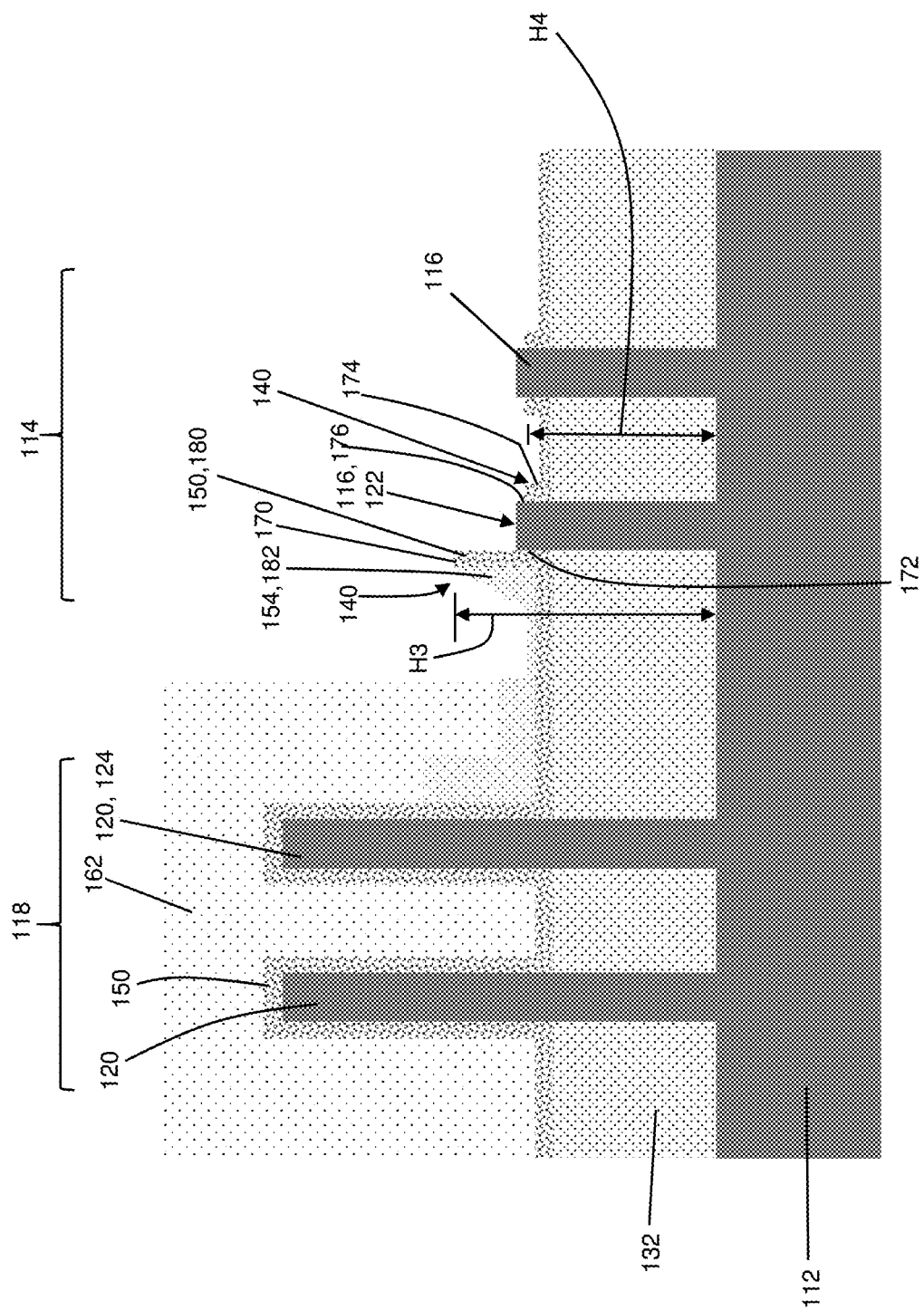
FIG. 6A shows a cross-sectional view of forming a first spacer including a first inner spacer, according to one embodiment of the disclosure.
Figure 6B:
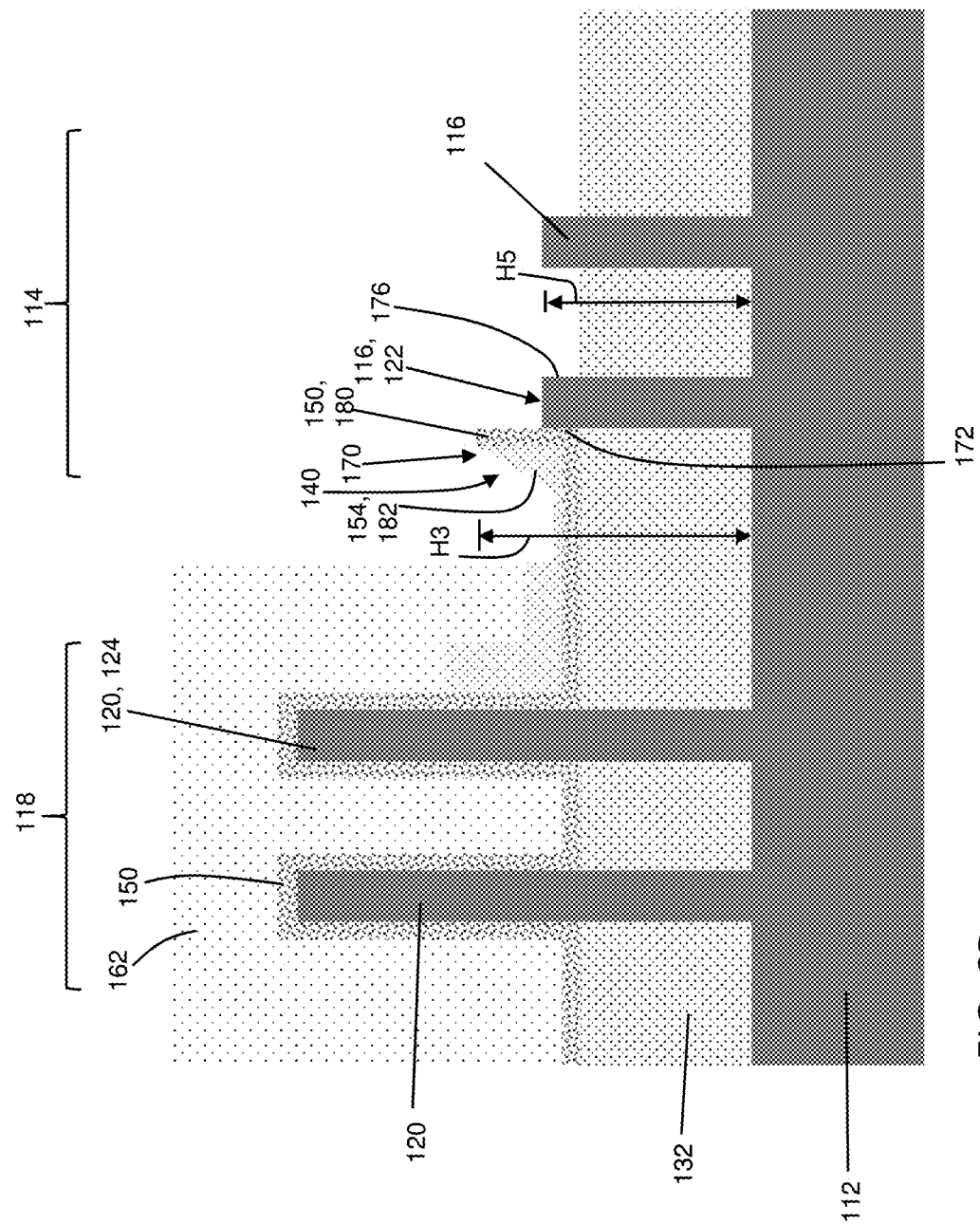
FIG. 6B shows a cross-sectional view of forming the first spacer including the first inner spacer, according to another embodiment of the disclosure.

FIGS. 5, 6A and 6B show cross-sectional views of etching first set of active regions 116 and first and second spacer layers 150, 154 thereover. As illustrated in FIG. 5, this process occurs with second set of active regions 120 masked off. More specifically, a mask 162 may be formed over second set of active regions 120. Mask 162 may include any now known or later developed masking material, e.g., similar to that of mask 160, and may be formed using any now known or later developed semiconductor techniques. As shown in FIGS. 6A and 6B, the etching leaves (forms) first inner spacer 170 adjacent an inner sidewall 164 of first inner active region 122. A height H3 of first spacer 140 is at least partly defined by a height H1 of mask 160 (FIG. 3), which defines a height of second spacer layer 154. That is, second spacer layer 154 height defines, in part, the height H3 of first spacer 140. The etching process shown in FIGS. 6A and 6B may occur in a number of steps. More particularly, in one embodiment, etching first set of active regions 116 and first and second spacer layers 150, 154 thereover may include a first etching of first and second spacer layers 150, 154. This first etching may include, for example, a flourine-based wet etch that "pulls back" first and second spacer layers 150, 154. The duration of the first etching can be regulated to control the extent of removal of the layers. Notably, as shown in FIG. 6A, the first etching duration can be regulated to form first spacer 140 with a first inner spacer 170 on an inner sidewall 172 of first inner active region 122 that is taller than any first outer spacer 174 on an outer sidewall 176 of first inner active region 122. That is, the etching of first set of active regions 116 and first and second spacer layers 150, 154 thereover, can be controlled to remove at least part of first outer spacer 174 adjacent outer sidewall 176 of first inner active region 122 such that first inner spacer 170 has a height H3 greater than any remaining part of the first outer spacer 174. Here, first spacer 140 includes an inner and outer spacer 170, 174.

In contrast, as shown in FIG. 6B, the first etching can be controlled to remove first spacer layer 150 (FIG. 5) entirely from outer sidewall 176 of first inner active region 122, leaving no outer spacer 174 (FIG. 6A). Here, first spacer 140 includes only first inner spacer 170 on inner sidewall 172 of first inner active region 122. As will be described, the asymmetrical heights of first inner spacer 170 compared to any first outer spacer 174 (FIG. 6A) allows first inner spacer 170 to be used to control the lateral formation, e.g., via epitaxy, of semiconductor layers over first inner active region 122.

FIGS. 6A-6B also show a second etching of first set of active regions 116, i.e., an active region recessing. The second etching may include using a chlorine-based wet etch (e.g., hydrochloric acid (HCL)) configured for the semiconductor material of the active regions. As illustrated, a height H5 of first set of active regions 116 can be shorter than height H3 of first inner spacer 170.

As shown in FIGS. 6A-B, first spacer 140 may include first spacer layer 150 and may include remnants of second spacer layer 154. As a result, first inner spacer 170 includes an outer portion 180 having an L-shape with the L-shape abutting a respective first inner active region 122 (i.e., inner sidewall 172) and STI 132 adjacent to the respective first inner active region 122. First inner spacer 170 may also include an inner portion 182 positioned in an inner corner of the L-shape. As noted, inner portion 182 includes second spacer layer 154 and outer portion 180 includes the different material of first spacer layer 150. Inner portion 182 may be angled in the corner of the L-shape. In some cases, second spacer layer 154 may also be removed entirely.

Figure 7:
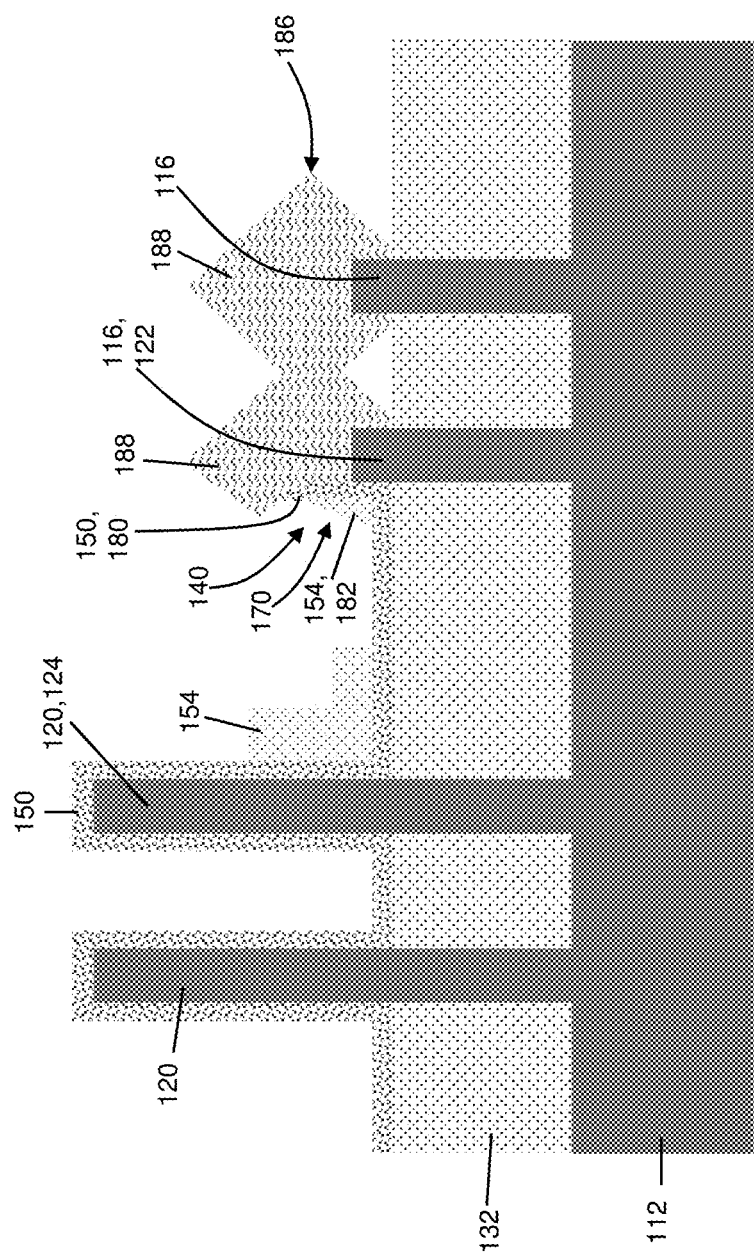
FIG. 7 shows a cross-sectional view of forming a semiconductor layer using the first spacer, according to one embodiment of the disclosure.

As shown in FIG. 7, once the etching of FIGS. 6A-6B is complete, mask 162 may be removed, e.g., using any now known or later developed ashing process appropriate for the material of mask 162. Mask 162 removal may also remove a remaining portion of second spacer layer 154 on an upward facing surface of an L-shaped outer portion 180 of first spacer 140. FIG. 7 shows a cross-sectional view of forming a first semiconductor layer 186 over first set of active regions 116 including first inner active region 122. (FIG. 7 shows the FIG. 6B embodiment; it is understood that the FIG. 7 process is equally applicable to the FIG. 6A embodiment.) Semiconductor layer 186 may be formed using, for example, epitaxy; thus forming source/drain epitaxy regions 188. Typically, epitaxy regions 188 have a diamond shape, e.g., when formed on a top of a semiconductor fin. As shown in FIG. 7, first inner spacer 170 abuts and limits lateral forming of first semiconductor layer 186. Thus, first inner spacer 170 allows for generation of a large semiconductor layer 186, but prevents its formation in a manner towards second set of active regions 120. Thus, as will be described further, first inner spacer 170 prevents electrical shorts with a semiconductor layer 220 (FIG. 9) to be formed over second set of active regions 120.

Figure 8A:
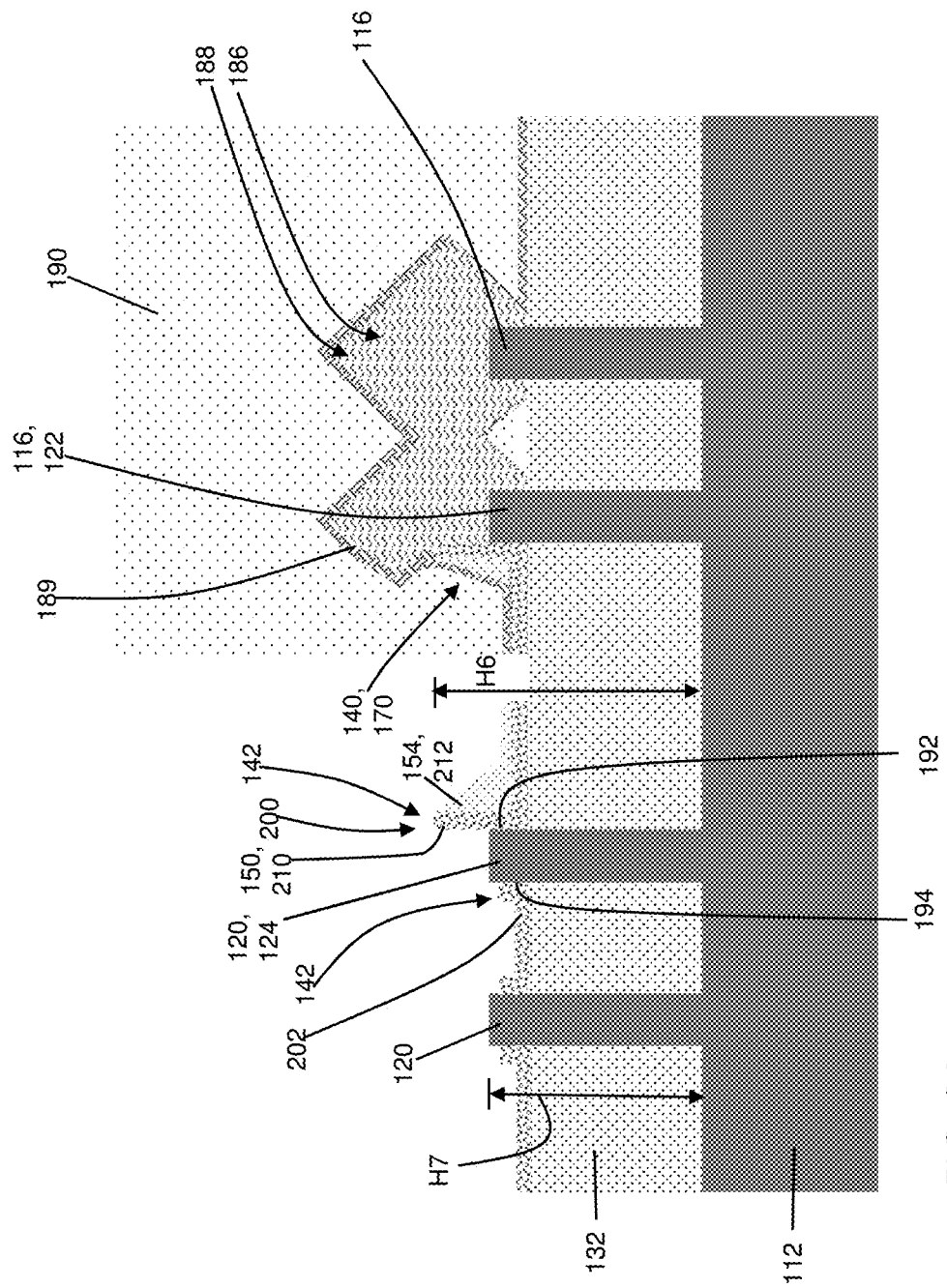
FIG. 8A shows a cross-sectional view of forming a second spacer including a second inner spacer, according to one embodiment of the disclosure.

FIGS. 8A, 8B and 9 show cross-sectional view of forming second spacer 142 on sidewalls of second inner active region 124 of second set of active regions 120, subsequent to forming first semiconductor layer 186. As an initial step, first semiconductor layer 186 may have a cap layer 189 applied thereto, e.g., of silicon nitride. A height H6 of second spacer 142 is at least partly defined by a height H1 of mask 160 (FIG. 3). That is, mask 160 at least partly defines a height of second spacer layer 154, i.e., second spacer layer 154 defines, in part, the height H6 of first spacer 140. As illustrated in FIGS. 8A and 8B, second spacer 142 formation process occurs with first set of active regions 116 masked off. That is, a mask 190 is formed over first set of active regions 116, i.e., first semiconductor layer 186 and cap layer 189. Mask 190 may include any now known or later developed masking material, e.g., similar to that of masks 160, 162. As shown in FIGS. 8A and 8, the etching leaves (forms) a second inner spacer 200 adjacent inner sidewall 192 of second inner active region 124. As with the etching shown in FIGS. 6A-6B, the etching process shown in FIGS. 8A and 8B may occur in a number of steps. More particularly, as in FIGS. 6A-6B, in one embodiment, etching second set of active regions 120 and first and second spacer layers 150, 154 thereover may include a first etching of first and second spacer layer 150, 154. This first etching may include, for example, a flourine-based wet etch that "pulls back" first and second spacer layers 150, 154. The duration of the first etching can be regulated to control the extent of removal of the layers. Notably, as shown in FIG. 8A, the first etching duration can be regulated to form second spacer 142 with second inner spacer 200 on inner sidewall 192 of second inner active region 124 that is taller than any second outer spacer 202 on an outer sidewall 194 of second inner active region 124. That is, the etching of second set of active regions 120 and first and second spacer layers 150, 154 thereover, can be controlled to remove at least part of second outer spacer 202 adjacent outer sidewall 194 of second inner active region 124 such that second inner spacer 200 has a height H6 greater than any remaining part of second outer spacer 202, i.e., height H7. Here, second spacer 142 includes an inner and outer spacers 200, 202.

In contrast, as shown in FIG. 8B, the first etching can be controlled to remove first spacer layer 150 (FIG. 5) entirely from outer sidewall 194 of second inner active region 124, leaving no outer spacer 202 (FIG. 8A). Here, second spacer 142 includes only inner spacer 200 on inner sidewall 192 of second inner active region 124. As will be described, the asymmetrical heights of second inner spacer 200 compared to any second outer spacer 202 (FIG. 8A) allows second inner spacer 200, similarly to first inner spacer 170 (FIG. 7) to be used to control the lateral formation, e.g., via epitaxy, of semiconductor layer 220 (FIG. 9) over second inner active region 124. As shown in FIG. 9, the first etching may also remove a remaining portion of first spacer layer 150 over STI 132 between first spacer 140 and second spacer 142, exposing an upper surface of STI 132.

FIGS. 8A-8B also show a second etching of second set of active regions 120, i.e., an active region recessing. As with first set of active regions 116, the second etching may include using a chlorine-based wet etch (e.g., hydrochloric acid (HCL)) configured for the semiconductor material of set of active regions 120. As illustrated, a height H8 of second set of active regions 120 can be shorter than height H6 of second inner spacer 200. As shown in FIG. 9, once the etching is complete, mask 190 may be removed, e.g., using any now known or later developed ashing process appropriate for the material of mask 190. Mask 190 removal may also remove a remaining portion of second spacer layer 154 on an upward facing surface of the L-shaped outer portion 210 thereof.

As shown in FIGS. 8A-B, as with first spacer 140, second spacer 142 may include first spacer layer 150 and may include remnants of second spacer layer 154. As a result, second inner spacer 200 includes an outer portion 210 having an L-shape with the L-shape abutting a respective second inner active region 124 (i.e., inner sidewall 192) and STI 132 adjacent to the respective second inner active region 124. Second inner spacer 200 also includes an inner portion 212 positioned in an inner corner of the L-shape. As noted, inner portion 212 includes second spacer layer 154 and outer portion 210 includes the different material of first spacer layer 150. Inner portion 212 is angled in the corner of the L-shape.

FIG. 9 shows a cross-sectional view of forming a second semiconductor layer 220 over second set of active regions 120 including second inner active region 124. (FIG. 9 shows the FIG. 8B embodiment; it is understood that the FIG. 9 process is equally applicable to the FIG. 8A embodiment.) Semiconductor layer 220 may be formed using, for example, epitaxy; thus forming source/drain epitaxy regions 222. Typically, as noted relative to epitaxy regions 188 (FIG. 7), epitaxy regions 222 have a diamond shape, e.g., when formed on a top of a semiconductor fin. As shown in FIG. 9, second inner spacer 200, similar to first inner spacer 170, abuts and limits lateral forming of second semiconductor layer 220. Thus, second inner spacer 200 allows for generation of a large semiconductor layer 220, but limits its formation in a manner towards first set of active regions 116. The method prevents shorting between source/drain epitaxy regions 188.

As shown in FIG. 9, both inner spacers 170, 200 thus allow for formation of large semiconductor layers 186, 220, and source/drain epitaxy regions 188, 222, compared to conventional processing. In one non-limiting example, for a 14 nanometer technology node, source/drain epitaxy regions 188, 222 may have a lateral dimension of greater than 50 nanometers. However, as shown in FIG. 9, first and second semiconductor layers 186, 220 remain separated from one another despite the larger lateral dimension. Inner spacers 170, 200 prevent merger of semiconductor layers 186, 220, and thus prevent electrical shorts between the source/drain epitaxy regions 188, 222.

Subsequent processing may form contacts 230 through an interlayer dielectric 232 to source/drain epitaxy regions 188, 222. This processing is well known and thus will not be described in greater detail.

FIG. 9 also shows a structure 240 according to embodiments of the disclosure. Structure 240 may include substrate 112 having first set of active regions 116 and second set of active regions 120. As noted, first set of active regions 116 has first inner active region 122 adjacent to and spaced from second inner active region 124 of second set of active regions 120. In one embodiment, each inner spacer 170, 200 includes an outer portion 180 having an L-shape, the L-shape abutting a respective inner active region 122, 124 and STI 132 adjacent to the respective inner active region 122, 124. Each inner spacer 170, 200 may also include an inner portion 182, 212 positioned in an inner corner of the L-shape. Inner portions 182, 212 (i.e., of second spacer layer 154) includes a different material than the outer portion of first spacer layer 150 (i.e., of first spacer layer 150).

Sets of active regions 116, 120 may include semiconductor fins, but may be other forms of active regions also, e.g., bulk, nanosheets, etc. Structure 240 also includes first inner spacer 170 on first inner active region 122, and second inner spacer 200 on second inner active region 124.

Structure 240 also includes first semiconductor (epitaxy) layer 186 over first set of active regions 116, including first inner active region 122. First semiconductor layer 186, e.g., for source/drain epitaxy, abuts first inner spacer 170. Second semiconductor (epitaxy) layer 220 is over second set of active regions 120, including second inner active region 124. Second semiconductor layer 220, e.g., for source/drain epitaxy, abuts second inner spacer 200. In structure 240, first and second semiconductor layers 186, 220 are separated from one another, preventing shorts therebetween.

In certain embodiments, shown in FIG. 6A, structure 240 may also include first outer spacer 174 on an opposing side of first inner active region 122 from first inner spacer 170. First outer spacer 174 has a height H4 that is different than first inner spacer 170, i.e., it's less. In certain embodiments, shown in FIG. 8A, structure 240 may also include second outer spacer 202 on an opposing side of second inner active region 124 from second inner spacer 200. Second outer spacer 202 has a height H7 that is different than second inner spacer 200, i.e., it's less. In other embodiments, as shown in FIG. 6B, first inner active region 122 has no spacer on a side thereof opposite first inner spacer 170, and, as shown in FIG. 8B, second inner active region 124 has no spacer on a side thereof opposite second inner spacer 200.

Embodiments of the disclosure provide semiconductor epitaxy regions 188, 222 that are larger than a self-limited diamond size (e.g., for fins), and which can vary depending on technology node. Despites the larger size, the higher inner spacers prevent shorts between the epitaxy regions 188, 222.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. A structure, comprising:
a substrate having a first set of active regions and a second set of active regions, the first set of active regions having a first inner active region adjacent to and spaced from a second inner active region of the second set of active regions;

a first inner spacer on the first inner active region;
a second inner spacer on the second inner active region;
a first semiconductor layer over the first set of active regions, including the first inner active region, the first semiconductor layer abutting the first inner spacer; and
a second semiconductor layer over the second set of active regions, including the second inner active region, the second semiconductor layer abutting the second inner spacer,
wherein the first semiconductor layer and the second semiconductor layer are separated from one another, and
wherein the first inner active region is free of a spacer material on a side thereof opposite the first inner spacer, and the second inner active region is free of the spacer material on a side thereof opposite the second inner spacer.

2. The structure of claim 1, wherein each inner spacer includes an outer portion having an L-shape, the L-shape abutting a respective inner active region.

3. The structure of claim 2, wherein each inner spacer includes an inner portion positioned in an inner corner of the L-shape, the inner portion including a different material than a material of the outer portion.

4. The structure of claim 1, wherein each active region includes a semiconductor fin.

5. The structure of claim 1, further comprising a shallow trench isolation, wherein each inner spacer includes an outer portion having an L-shape, the L-shape abutting a respective inner active region, and wherein the shallow trench isolation of the structure is adjacent to the respective inner active region.

6. A structure, comprising:
a substrate having a first set of fins and a second set of fins, the first set of fins having a first inner fin adjacent to and spaced from a second inner fin of the second set of fins;
a first inner spacer on the first inner fin;
a second inner spacer on the second inner fin;
a first semiconductor epitaxy layer over the first set of fins, including the first inner fin, the first semiconductor epitaxy layer abutting the first inner spacer; and
a second semiconductor epitaxy layer over the second set of fins, including the second inner fin, the second semiconductor epitaxy layer abutting the second inner spacer, and
wherein the first semiconductor epitaxy layer and the second semiconductor epitaxy layer are separated from one another, and
wherein the first inner fin is free of a spacer material on a side thereof opposite the first inner spacer, and the second inner fin is free of the spacer material on a side thereof opposite the second inner spacer.

7. The structure of claim 6, wherein each inner spacer includes an outer portion having an L-shape, the L-shape abutting a respective inner fin, and an inner portion positioned in an inner corner of the L-shape, the inner portion including a different material than a material of the outer portion.

8. The structure of claim 6, wherein each inner spacer includes an outer portion having an L-shape, the L-shape abutting a respective inner fin, and an inner portion positioned in an inner corner of the L-shape.

9. A method, comprising:
at a boundary area on a substrate between a first polarity region including a first set of active regions and a second polarity region including a second set of active regions spaced from the first set of active regions:
forming a first spacer on a sidewalls of a first inner active region, the first spacer including a first inner spacer on an inner sidewall of the first inner active region;
forming a first semiconductor layer over the first set of active regions including the first inner active region, the first inner spacer abutting and limiting lateral forming of the first semiconductor layer;
forming a second spacer on a sidewalls of a second inner active region of the second set of active regions, the second spacer including a second inner spacer on an inner sidewall of the second inner active region of the second set of active regions; and
forming a second semiconductor layer over the second set of active regions including the second inner active region, the second inner spacer abutting and limiting lateral forming of the second semiconductor layer,
wherein the first semiconductor layer and the second semiconductor layer are separated from one another, and
wherein the first inner active region is free of a spacer material on a side thereof opposite the first inner spacer, and the second inner active region is free of the spacer material on a side thereof opposite the second inner spacer.

10. The method of claim 9, wherein:
forming the first spacer and the second spacer includes:
forming a first spacer layer over the first set of active regions including the first inner active region and the second set of active regions including the second inner active region;
forming a second spacer layer over the first spacer layer, preserving space between the first and second inner active regions;
forming a recessed second spacer layer at the boundary area, the recessed second spacer layer having a first height less than a second height of the first and second inner active regions, wherein the first height and the second height are relative to an upper surface of the substrate;
forming the first inner spacer adjacent the inner sidewall of the first inner active region; and
forming the second inner spacer adjacent the inner sidewall of the second inner active region.

11. The method of claim 10, wherein forming the first inner spacer adjacent the inner sidewall of the first inner active region includes a first recessing of the first spacer layer and the second spacer layer and a second recessing of the first set of active regions, and
wherein forming the second inner spacer adjacent the inner sidewall of the second inner active region includes a third recessing of the first spacer layer and the second spacer layer and a fourth recessing of the second set of active regions.

12. The method of claim 10, wherein forming the first inner spacer adjacent the inner sidewall of the first inner active region further includes recessing a first outer spacer adjacent an outer sidewall of the first inner active region such the first inner active region is free of a spacer material on a side thereof opposite the first inner spacer.

13. The method of claim 4, wherein forming the second inner spacer adjacent the inner sidewall of the second inner active region further includes recessing a second outer spacer adjacent an outer sidewall of the second inner active region such that the second inner active region is free of a spacer material on a side thereof opposite the second inner spacer.

14. The method of claim 9, wherein the second spacer layer includes a material different than a material of the first spacer layer.

15. The method of claim 9, wherein each inner spacer includes an outer portion having an L-shape, the L-shape abutting a respective inner active region, and an inner portion positioned in an inner corner of the L-shape, the inner portion including a material different than a material of the outer portion.

16. The method of claim 9, wherein each active region includes a semiconductor fin.

17. The method of claim 9, wherein each inner spacer includes an outer portion having an L-shape, the L-shape abutting a respective inner fin, and an inner portion positioned in an inner corner of the L-shape, the inner portion including a different material than a material of the outer portion.

18. The method of claim 10, wherein the second spacer layer includes a material different than a material of the first spacer layer.

19. The method of claim 2, wherein each inner spacer further includes an inner portion positioned in an inner corner of the L-shape, the inner portion including a material of the second spacer layer and the outer portion including a material of the first spacer layer.

20. The method of claim 6, wherein the material of the second spacer layer is different than the material of the first spacer layer.

* * * * *